(12) United States Patent   (10) Patent No.: US 8,067,950 B2
Nagai et al.   (45) Date of Patent: Nov. 29, 2011

(54) SEMICONDUCTOR DEVICE INCLUDING CHIP

(75) Inventors: Noriyuki Nagai, Nara (JP); Takatoshi Osumi, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/711,829

(22) Filed: Feb. 24, 2010

(65) Prior Publication Data

US 2010/0148812 A1   Jun. 17, 2010

Related U.S. Application Data

(63) Continuation of application No. PCT/JP2009/003380, filed on Jul. 17, 2009.

(30) Foreign Application Priority Data

Dec. 1, 2008 (JP) ................................. 2008-306240

(51) Int. Cl.
*G01R 31/3187* (2006.01)
*G01R 31/02* (2006.01)

(52) U.S. Cl. ................................ 324/750.3; 324/762.01

(58) Field of Classification Search .................. None
See application file for complete search history.

(56) References Cited

U.S. PATENT DOCUMENTS

| 5,726,502 | A | * | 3/1998 | Beddingfield | 257/797 |
| 5,828,128 | A | * | 10/1998 | Higashiguchi et al. | 257/738 |
| 2002/0086515 | A1 | * | 7/2002 | Fukuyama | 438/616 |

FOREIGN PATENT DOCUMENTS

| JP | 02-251162 | | 10/1990 |
| JP | 07-050330 | | 2/1995 |
| JP | 08-037357 | | 2/1996 |
| JP | 08-153747 | | 6/1996 |
| JP | 09-246426 | | 9/1997 |
| JP | 10-335520 | | 12/1998 |
| JP | 11-054881 | | 2/1999 |
| JP | 2002-090422 | | 3/2002 |
| JP | 2002090422 A | * | 3/2002 |
| JP | 2006-005163 | | 1/2006 |
| JP | 2006005163 A | * | 1/2006 |

* cited by examiner

*Primary Examiner* — Jermele M Hollington

(74) *Attorney, Agent, or Firm* — McDermott Will & Emery LLP

(57) ABSTRACT

A semiconductor device in which a chip 10 is mounted on a board, includes: a pad group A provided on the chip 10 and electrically connected to an internal circuit in the chip 10; and a test pad pattern B provided on a region of the chip 10 except for a region of the chip 10 where the pad group A is provided. The pad group A includes: pads 12a formed on a principal surface of the chip 10; bumps 16a respectively formed on the pads 12a with a barrier metal layer interposed therebetween, and electrically connected to the board. The test pad pattern B includes: test pads 12b formed on the principal surface of the chip 10; test bumps 16b respectively formed on the test pads 12b with a test barrier metal layer interposed therebetween, and interconnects 11b electrically connecting adjacent ones of the test pads 12b.

20 Claims, 11 Drawing Sheets

US 8,067,950 B2

SEMICONDUCTOR DEVICE INCLUDING CHIP

This is a continuation of PCT International Application PCT/JP2009/003380 filed on Jul. 17, 2009, which claims priority to Japanese Patent Application No. 2008-306240 filed on Dec. 1, 2008. The disclosures of these applications including the specifications, the drawings, and the claims are hereby incorporated by reference in its entirety.

TECHNICAL FIELD

The present disclosure relates to semiconductor devices including chips mounted on boards.

BACKGROUND ART

A conventional semiconductor device will be described with reference to FIGS. 13, 14, and 15. FIG. 13 is a plan view illustrating a configuration of a chip in the conventional semiconductor device.

As illustrated in FIG. 13, pads 102 are arranged in an array on the principal surface of a chip 100 to be electrically connected to an internal circuit in the chip 100. Bumps 106 are respectively formed on the pads 102 with a barrier metal layer (not shown, and denoted by reference numeral 105 in FIG. 14) interposed therebetween.

FIG. 14 is a cross-sectional view illustrating the configuration of the chip in the conventional semiconductor device. Specifically, FIG. 14 is an enlarged cross-sectional view taken along line XIV-XIV in FIG. 13.

As illustrated in FIG. 14, the pads 102 are formed on an interlayer insulating film 100x. A first protective film 103 is formed over the interlayer insulating film 100x and the pads 102. The first protective film 103 has openings 103a in which the upper surfaces of the pads 102 are exposed. A second protective film 104 is formed on a region of the first protective film 103 except for a region on which the pads 102 are formed. The barrier metal layer 105 is formed on the pads 102 to fill the openings 103a. The bumps 106 are formed on the barrier metal layer 105.

FIG. 15 is a cross-sectional view illustrating a configuration of the conventional semiconductor device. Specifically, this cross-sectional view illustrates a configuration of the semiconductor device in which the chip with the configuration shown in FIG. 13 is mounted on the board. The cross-sectional view of the chip shown as the upper chip in FIG. 15 is the cross-sectional view taken along line XV-XV in FIG. 13.

As illustrated in FIG. 15, the chip 100 is connected to the board 200 having terminals 201 via the bumps 106. The gap between the board 200 and the chip 100 is filled with resin 202. In this manner, the chip 100 is mounted on the board 200.

The chip 100 and the board 200 greatly differ in thermal expansion coefficient. Thus, when thermal stress is applied to the pad 102-bump 106 portion sandwiched between the board 200 and the chip 100 in mounting the chip on the board, for example, reliability of the connection between the pad 102-bump 106 portion and the board 200 is reduced (see, for example, Japanese Patent Publication No. 8-153747).

SUMMARY

In general, the connection state between pads and bumps before mounting of a chip on aboard is determined by visual inspection.

However, visual inspection is not reliable, and thus a poor connection state between the pads and the bumps might be determined to be "good." The poor connection state of the pad-bump portion might reduce the connection reliability between the pad-bump portion and the board in the subsequent process step of mounting the chip on the board.

It is therefore an object of the present disclosure to enhance reliability in determining the connection state between pads and bumps before a chip is mounted on a board.

To achieve the above object, in an aspect of the present disclosure, a semiconductor device includes: a board; a chip mounted on the board; a pad group provided on the chip and electrically connected to an internal circuit in the chip; and a test pad pattern provided on a region of the chip except for a region of the chip where the pad group is provided. In the semiconductor device, the pad group includes a plurality of pads formed on a principal surface of the chip, and a plurality of bumps respectively formed on the pads with a barrier metal layer interposed therebetween, and electrically connected to the board, and the test pad pattern includes a plurality of test pads formed on the principal surface of the chip, a plurality of test bumps respectively formed on the test pads with a test barrier metal layer interposed therebetween, and interconnects electrically connecting adjacent ones of the test pads.

In this aspect, the connection state between the test pads and the test bumps before a chip-on-board mounting step can be electrically tested (i.e., a mid-fabrication test can be performed in the middle of fabrication of the semiconductor device) by using the test pad patterns. Then, based on the determination result (i.e., the determination result on the connection state between the test pads and the test bumps) in the mid-fabrication test, the connection state between the pads and the bumps before the chip-on-board mounting step can be determined, thereby enhancing reliability in determining the connection state between the pads and the bumps. Accordingly, the reliability of the semiconductor device can be increased by mounting, on the board, a chip in which the connection state between pads and bumps has been determined to be good based on the determination result in the mid-fabrication test.

In the above semiconductor device, the test bumps preferably have a height equal to a height of the bumps.

In this configuration, the connection state between the test pad-bump portion and the board after the chip-on-board mounting step can be electrically tested (i.e., a final test can be performed after fabrication of the semiconductor device) by using the test pad pattern. Then, based on the determination result (i.e., the determination result on the connection state between the test pad-bump portion and the board) in the final test, the connection state between the pad-bump portion and the board after the chip-on-board mounting step can be determined.

In the above semiconductor device, each of the test bumps preferably has a height smaller than a height of each of the bumps. In this case, pedestals electrically connecting the test bumps to the board are preferably formed on the board.

In this configuration, the connection state between the test pad-bump portion and the board after the chip-on-board mounting step can be electrically tested by using the test pad pattern. Then, based on the determination result in the final test, the connection state between the pad-bump portion and the board after the chip-on-board mounting step can be determined.

In the above semiconductor device, a distance between the test pad pattern and a center of the chip is preferably larger than a distance between the pad group and the center of the chip.

This configuration allows the possibility that the test pad-bump portion and the board are in a poor connection state to be higher than the possibility that the pad-bump portion and the board are in a poor connection state in the chip-on-board mounting step. Accordingly, when the test pad-bump portion and the board are determined to be in a good connection state in the final test, the pad-bump portion and the board can be determined to be in a good connection state correspondingly. As a result, it is possible to enhance reliability in determining the connection state between the pad-bump portion and the board.

In the above semiconductor device, the test pads and the pads may have polygonal planar shapes, and a planar shape of each of the test pads may have an interior angle smaller than an interior angle of a planar shape of each of the pads. Alternatively, the test pads may have polygonal planar shapes, and the pads may have circular or oval planar shapes.

This configuration allows the possibility that the test pad-bump portion and the board are in a poor connection state to be higher than the possibility that the pad-bump portion and the board are in a poor connection state in the chip-on-board mounting step. Accordingly, when the test pad-bump portion and the board are determined to be in a good connection state in the final test, the pad-bump portion and the board can be determined to be in a good connection state correspondingly. As a result, it is possible to enhance reliability in determining the connection state between the pad-bump portion and the board.

In the above semiconductor device, each of the test pads preferably has a width smaller than a width of the test barrier metal layer, and each of the pads preferably has a width larger than a width of the barrier metal layer.

This configuration allows the possibility that the test pad-bump portion and the board are in a poor connection state to be higher than the possibility that the pad-bump portion and the board are in a poor connection state in the chip-on-board mounting step. Accordingly, when the test pad-bump portion and the board are determined to be in a good connection state in the final test, the pad-bump portion and the board can be determined to be in a good connection state correspondingly. As a result, it is possible to enhance reliability in determining the connection state between the pad-bump portion and the board.

In the above semiconductor device, each of the test bumps preferably has a width smaller than a width of each of the bumps.

This configuration allows the possibility that the test pad-bump portion and the board are in a poor connection state to be higher than the possibility that the pad-bump portion and the board are in a poor connection state in the chip-on-board mounting step. Accordingly, when the test pad-bump portion and the board are determined to be in a good connection state in the final test, the pad-bump portion and the board can be determined to be in a good connection state correspondingly. As a result, reliability in determining the connection state between the pad-bump portion and the board can be enhanced.

In the above semiconductor device, the bumps and the test bumps are preferably gold bumps or solder bumps.

In the above semiconductor device, the pads and the test pads preferably contain aluminum, and the barrier metal layer and the test barrier metal layer preferably contain nickel.

To achieve the above object, in an aspect of the present disclosure, a chip to be mounted on a board, includes: a pad group provided on the chip and electrically connected to an internal circuit in the chip; and a test pad pattern provided on a region of the chip except for a region of the chip where the pad group is provided. In the chip, the pad group includes a plurality of pads formed on a principal surface of the chip, and a plurality of bumps respectively formed on the pads with a barrier metal layer interposed therebetween, and configured to be electrically connected to the board, and the test pad pattern includes a plurality of test pads formed on the principal surface of the chip, a plurality of test bumps respectively formed on the test pads with a test barrier metal layer interposed therebetween, and interconnects electrically connecting adjacent ones of the test pads.

In the above chip, the connection state between the test pads and the test bumps before the chip-on-board mounting step can be electrically tested by using the test pad pattern. Then, based on the determination result in the mid-fabrication test, the connection state between the pads and the bumps before the chip-on-board mounting step can be determined, thereby enhancing reliability in determining the connection state between the pads and the bumps.

In the semiconductor device according to the present disclosure, the connection state between the test pads and the test bumps before the chip-on-board mounting step can be electrically tested (i.e., a mid-fabrication test can be performed in the middle of fabrication of the semiconductor device) by using the test pad pattern. Then, based on the determination result (i.e., the determination result on the connection state between the test pads and the test bumps) in the mid-fabrication test, the connection state between the pads and the bumps can be determined, thereby enhancing reliability in determining the connection state between the pads and the bumps. Accordingly, the reliability of the semiconductor device can be increased by mounting, on a board, a chip in which the connection state between pads and bumps has been determined to be good based on the determination result in the mid-fabrication test.

DETAILED DESCRIPTION

Embodiments of the present disclosure will be described hereinafter with reference to the drawings.

Embodiment 1

Figure 1:
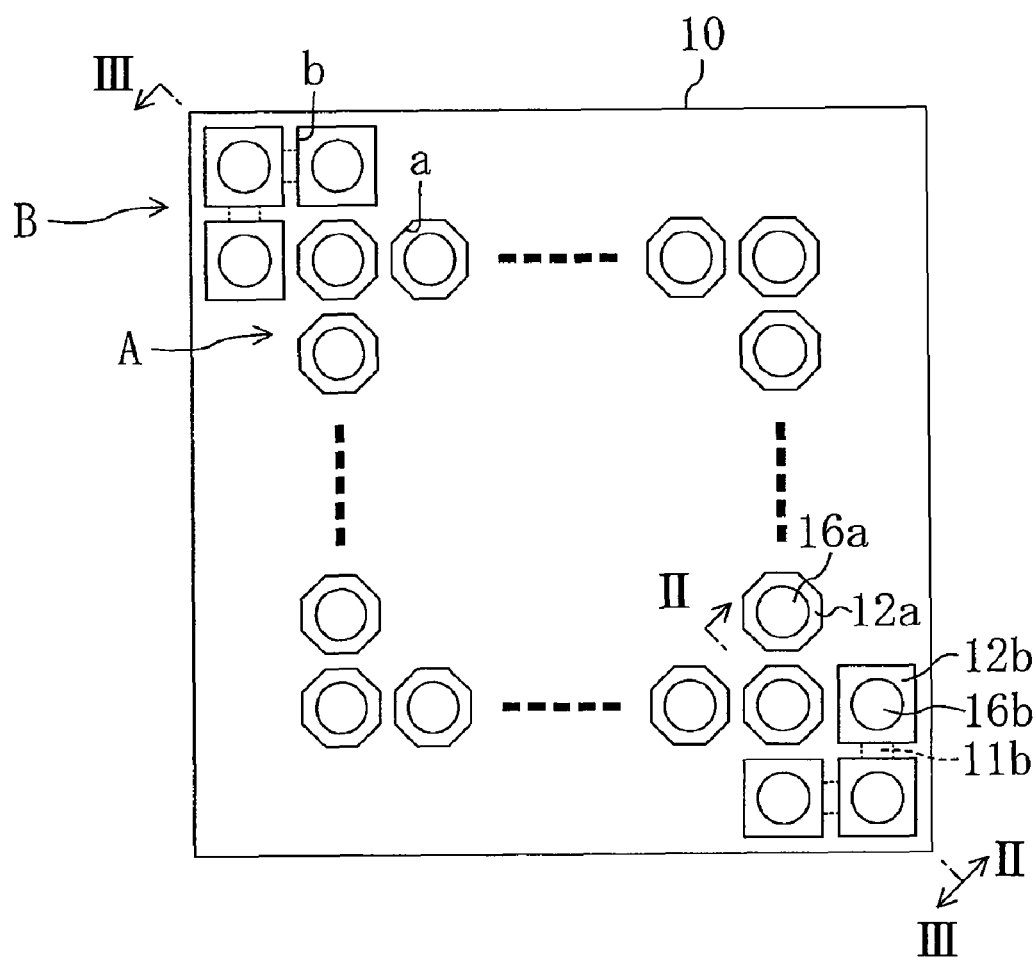
FIG. 1 is a plan view illustrating a configuration of a chip in a semiconductor device according to a first embodiment of the present disclosure.

A semiconductor device according to a first embodiment of the present disclosure will be described with reference to FIGS. 1, 2, and 3. FIG. 1 is a plan view illustrating a configuration of a chip in the semiconductor device of the first embodiment.

As illustrated in FIG. 1, a pad group A is provided on a chip 10 to be electrically connected to an internal circuit (not shown) in the chip 10. Test pad patterns B are provided on regions of the chip 10 except for the region on which the pad group A is provided. On the chip 10, the distance between each of the test pad patterns B and the center of the chip 10 is larger than the distance between the pad group A and the center of the chip 10.

As illustrated in FIG. 1, the pad group A includes: a plurality of pads 12a formed on the principal surface of the chip 10; and bumps 16a respectively formed on the pads 12a with a barrier metal layer (not shown, and denoted by reference numeral 15a in FIG. 2) interposed therebetween. The pads 12a are arranged in an array, and are electrically connected to the internal circuit in the chip 10.

On the other hand, as illustrated in FIG. 1, each of the test pad patterns B includes: a plurality of test pads 12b formed on the principal surface of the chip 10; test bumps 16b respectively formed on the test pads 12b with a test barrier metal layer (not shown, and denoted by reference numeral 15b in FIG. 2) interposed therebetween; and interconnects 11b electrically connecting adjacent ones of the test pads 12b. The test pads 12b are not electrically connected to the internal circuit in the chip 10. Although not shown in the cross-sectional view of FIG. 2, which will be described later, the interconnects 11b are formed in the uppermost interlayer insulating film (denoted by reference numeral 10x in FIG. 2).

The pads 12a and the test pads 12b are made of, for example, aluminum. The barrier metal layer 15a and the test barrier metal layer 15b are made of, for example, nickel. The bumps 16a and the test bumps 16b are, for example, gold bumps or solder bumps. In this embodiment and second and third embodiments, solder bumps are used as the bumps 16a and the test bumps 16b, as an example.

Figure 2:
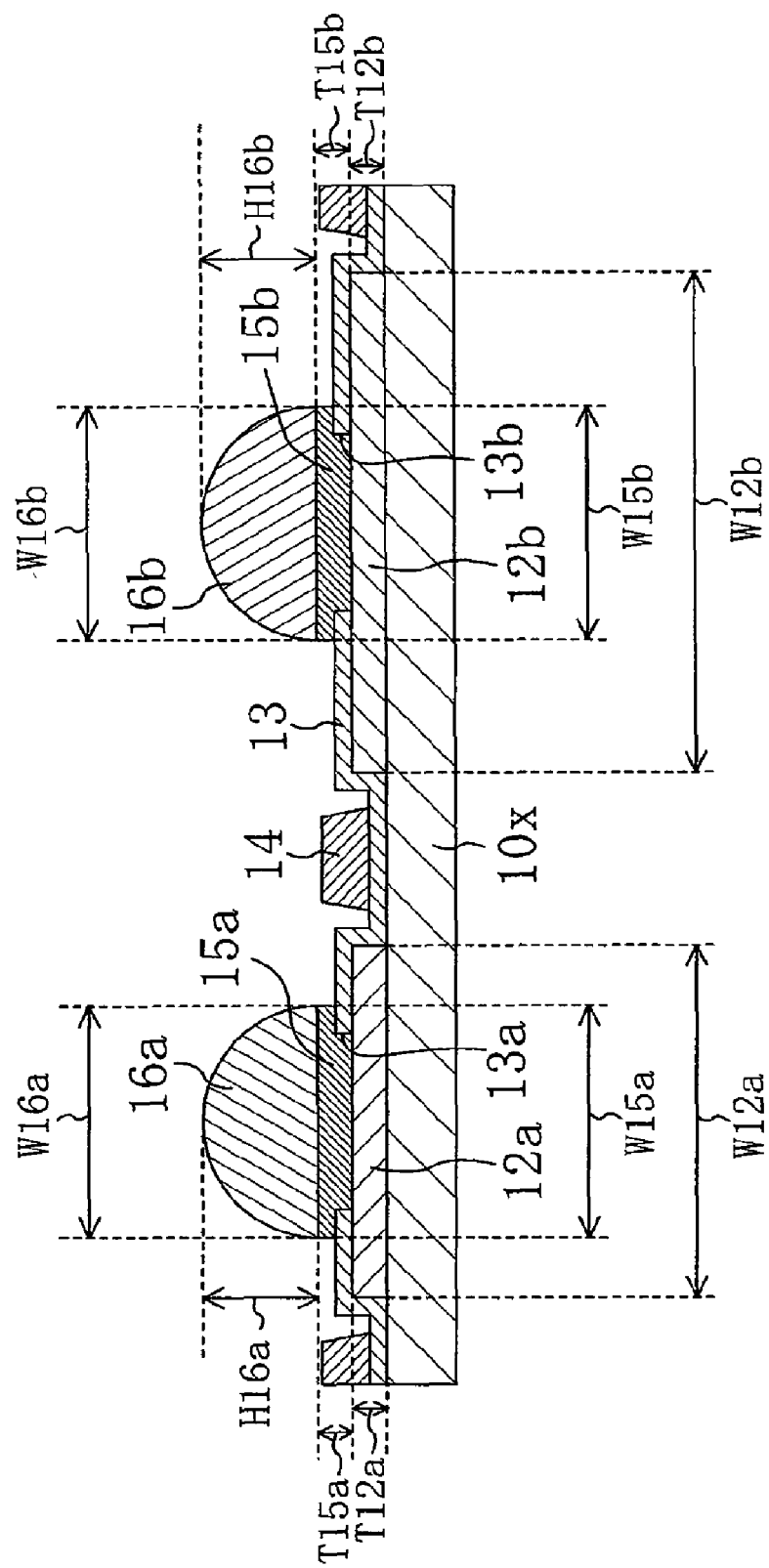
FIG. 2 is a cross-sectional view illustrating the configuration of the chip in the semiconductor device of the first embodiment.

FIG. 2 is a cross-sectional view illustrating the configuration of the chip in the semiconductor device of the first embodiment. Specifically, FIG. 2 is an enlarged cross-sectional view taken along line II-II in FIG. 1.

As illustrated in FIG. 2, the pads 12a and the test pads 12b are formed on an interlayer insulating film 10x. A first protective film 13 is formed over the interlayer insulating film 10x, the pads 12a, and the test pads 12b. The first protective film 13 has openings 13a in which the upper surfaces of the pads 12a are exposed and openings 13b in which the upper surfaces of the test pads 12b are exposed. A second protective film 14 is formed on a region of the first protective film 13 except for the region where the pads 12a and the test pads 12b are formed.

The barrier metal layer 15a is formed on the pads 12a to fill the openings 13a, and the test barrier metal layer 15b is formed on the test pads 12b to fill the openings 13b. The bumps 16a are formed on the barrier metal layer 15a, and the test bumps 16b are formed on the test barrier metal layer 15b. For simplicity, FIG. 2 does not show an interlayer insulating film formed under the uppermost interlayer insulating film 10x, signal lines and other components formed in the interlayer insulating film under the uppermost interlayer insulating film 10x, and the board on which the chip is mounted.

As illustrated in FIG. 2, the width W12b of the test pads 12b is larger than the width W12a of the pads 12a (i.e., W12b>W12a), and the thickness T12b of the test pads 12b is equal to the thickness T12a of the pads 12a (i.e., T12b=T12a). The width W15b of the test barrier metal layer 15b is equal to the width W15a of the barrier metal layer 15a (i.e., W15b=W15a), and the thickness T15b of the test barrier metal layer 15b is equal to the thickness T15a of the barrier metal layer 15a (i.e., T15b=T15a). The width W16b of the test bumps 16b is equal to the width W16a of the bumps 16a (i.e., W16b=W16a), and the height H16b of the test bumps 16b is equal to the height H16a of the bumps 16a (i.e., H16b=H16a). The thickness T15a of the barrier metal layer 15a is the thickness of a portion of the barrier metal layer 15a sandwiched between the pads 12a and the bumps 16a. The thickness T15b of the test barrier metal layer 15b is the thickness of a portion of the test barrier metal layer 15b sandwiched between the test pads 12b and the test bumps 16b.

Figure 3:
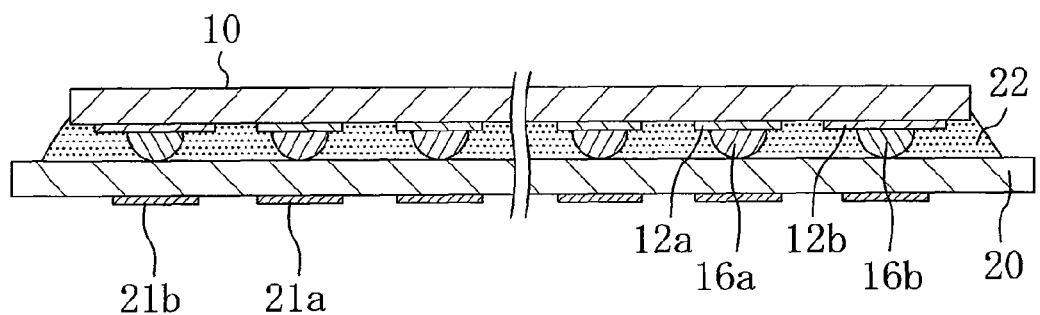
FIG. 3 is a cross-sectional view illustrating the configuration of the semiconductor device of the first embodiment.

FIG. 3 is a cross-sectional view illustrating the configuration of the semiconductor device of the first embodiment. Specifically, FIG. 3 is a cross-sectional view illustrating a configuration of the semiconductor device in which the chip with the configuration of FIG. 1 is mounted on the board. The cross-sectional view of the upper chip in FIG. 3 is the cross-sectional view taken along line III-III in FIG. 1.

As illustrated in FIG. 3, the chip 10 is connected to the board 20 having terminals 21a and 21b via the bumps 16a and the test bumps 16b. The gap between the board 20 and the chip 10 is filled with resin 22. In this manner, the chip 10 is mounted on the board 20.

The chip 10 is mounted on the board 20 such that the bumps 16a are associated with the terminals 21a and the test bumps 16b are associated with the terminals 21b. The bumps 16a and the terminals 21a are electrically connected to each other, and the test bumps 16b and the terminals 21b are electrically connected to each other.

A method for fabricating a semiconductor device according to the first embodiment will be described hereinafter.

First, a chip including bumps formed on pads and test bumps formed on test pads is prepared. This process step will be referred to as a "chip preparation step" hereinafter.

A board including terminals is also prepared. This process step will be referred to as a "board preparation step" hereinafter.

Next, the chip is positioned such that the bumps are connected to the terminals of the board and the test bumps are connected to the terminals of the board. This process step will be referred to as a "chip-board alignment step" hereinafter.

Then, as illustrated in FIG. 3, the bumps 16a and the test bumps 16b are welded, and the chip 10 is mounted on the board 20. Thereafter, the gap between the board 20 and the chip 10 is filled with resin 22, thereby completing mounting of the chip 10 on the board 20. This process step will be referred to as a "chip-on-board mounting step" hereinafter.

In this manner, the semiconductor device of this embodiment is fabricated.

Structural differences between the pad group A and the test pad patterns B will now be described.

As illustrated in FIG. 1, the pads 12a constituting the pad group A have octagonal planar shapes, whereas the test pads 12b constituting the test pad patterns B have rectangular planar shapes. Thus, the interior angles b of the planar shapes of the test pads 12b are smaller than the interior angles a of the planar shapes of the pads 12a (i.e., b<a).

A test method using the test pad patterns will be described hereinafter.

First, a mid-fabrication test which is performed in the middle of fabrication of the semiconductor device is described.

After the chip preparation step and before the chip-board alignment step, the connection state between the test pads and the test bumps is electrically tested by using the test pad patterns. Specifically, for example, a probe is placed on each of the test bumps, and current is caused to flow between adjacent ones of the test pads through the interconnect (denoted by reference numeral 11b in FIG. 1) electrically connecting the adjacent test pads to each other. In this manner, the resistance between the test pads and the test bumps is measured, and based on the obtained resistance value, the connection state between the test pads and the test bumps is determined. Specifically, when the resistance value is relatively small, the connection state between the test pads and the test bumps is determined to be good. On the other hand, when the resistance value is relatively large, the connection state between the test pads and the test bumps is determined to be poor.

In the foregoing manner, the connection state between the test pads and the test bumps before the chip-on-board mounting step is electrically tested by using the test pad patterns. Then, based on the determination result (i.e., the result of determination of the connection state between the test pads and the test bumps) in the mid-fabrication test, the connection state between the pads and bumps before the chip-on-board mounting step is determined.

Then, a final test performed after fabrication of a semiconductor device will be described with reference to FIG. 3.

After the chip-on-board mounting step (i.e., after fabrication of a semiconductor device), the connection state between the test pad 12b-bump 16b portion and the board 20 is electrically tested by using the test pad patterns. Specifically, for example, a probe is placed on each of the terminals 21b electrically connected to the test bumps 16b, and current is caused to flow between adjacent ones of the test pads 12b through the interconnect (denoted by reference numeral 11b in FIG. 1) electrically connecting the adjacent test pads 12b to each other. In this manner, the resistance between the test pads 12b and the test bumps 16b is measured, and based on the obtained resistance value, the connection state between the test pad 12b-bump 16b portion and the board 20 is determined.

In the foregoing manner, the connection state between the test pad 12b-bump 16b portion and the board 20 after the chip-on-board mounting step is electrically tested by using the test pad patterns. Then, based on the determination result (i.e., the result of determination of the connection state between the test pad 12b-bump 16b portion and the board 20) in the final test, the connection state between the pad 12a-bump 16a portion and the board 20 after the chip-on-board mounting step is determined.

In the chip-on-board mounting step, thermal stress applied to the chip increases as the distance from the center of the chip increases. Accordingly, as illustrated in FIG. 1, the test pad patterns B each located at a larger distance from the center of the chip 10 than the pad group A are subjected to greater thermal stress than the pad group A in the chip-on-board mounting step. Thus, the possibility that the test pad 12b-bump 16b portion and the board 20 are in a poor connection state is allowed to be higher than the possibility that the pad 12a-bump 16a portion and the board 20 are in a poor connection state in the chip-on-board mounting step.

That is, the test pad patterns B are positioned such that the distance between each of the test pad patterns B and the center of the chip 10 is larger than the distance between the pad group A and the center of the chip 10, thereby allowing the possibility that the test pad 12b-bump 16b portion and the board 20 are in a poor connection state to be higher than the possibility that the pad 12a-bump 16a portion and the board 20 are in a poor connection state in the chip-on-board mounting step.

At this time, in a case where the pads have polygonal planar shapes, thermal stress applied to the pads in the chip-on-board mounting step increases as the interior angles of the planar shapes of the pads decrease. In this case, as illustrated in FIG. 1, the test pads 12b having smaller interior angles of the planar shapes than the pads 12a are subjected to greater thermal stress than the pads 12a in the chip-on-board mounting step. Accordingly, the test pad 12b-bump 16b portion is more likely to be in a poor connection state with the board 20 in the chip-on-board mounting step than the pad 12a-bump 16a portion. The term "polygonal" herein includes triangles, rectangles, and other figures.

In other words, in a case where the test pads 12b are formed such that the interior angles b of the planar shapes of the test pads 12b are smaller than the interior angles a of the planar shapes of the pads 12a, the possibility that the test pad 12b-bump 16b portion and the board 20 are in a poor connection state is allowed to be higher than the possibility that the pad 12a-bump 16a portion and the board 20 are in a poor connection state in the chip-on-board mounting step.

In this manner, if the connection state between the test pad 12b-bump 16b portion and the board 20 is determined to be good in the final test, the connection state between the pad 12a-bump 16a portion and the board 20 is determined to be good correspondingly. As a result, it is possible to enhance reliability in determining the connection state between the pad 12a-bump 16a portion and the board 20.

In this embodiment, the connection state between the test pads and the test bumps before the chip-on-board mounting step can be electrically tested (i.e., the mid-fabrication test can be performed in the middle of fabrication of the semiconductor device) by using the test pad patterns. Then, based on the determination result (i.e., the determination result on the connection state between the test pads and the test bumps) in the mid-fabrication test, the connection state between the pads and the bumps before the chip-on-board mounting step can be determined, thereby enhancing reliability in determining the connection state between the pads and the bumps. Accordingly, the reliability of the semiconductor device can be increased by mounting, on a board, a chip in which the connection state between pads and bumps has been determined to be good based on the determination result in the mid-fabrication test.

In addition, the connection state between the test pad 12*b*-bump 16*b* portion and the board 20 after the chip-on-board mounting step can be electrically tested (i.e., the final test is performed after fabrication of the semiconductor device) by using the test pad patterns. Then, based on the determination result (i.e., the determination result on the connection state between the test pad 12*b*-bump 16*b* portion and the board 20) in the final test, the connection state between the pad 12*a*-bump 16*a* portion and the board 20 after the chip-on-board mounting step can be determined.

Further, as illustrated in FIG. 1, the test pad patterns B are positioned such that the distance between each of the test pad patterns B and the center of the chip 10 is larger than the distance between the pad group A and the center of the chip 10. Accordingly, the possibility that the test pad 12*b*-bump 16*b* portion and the board 20 are in a poor connection state is allowed to be higher than the possibility that the pad 12*a*-bump 16*a* portion and the board 20 are in a poor connection state in the chip-on-board mounting step. Furthermore, as illustrated in FIG. 1, the interior angles b of the planar shapes of the test pads 12*b* are smaller than the interior angles a of the planar shapes of the pads 12*a*. Accordingly, the possibility that the test pad 12*b*-bump 16*b* portion and the board 20 are in a poor connection state is allowed to be higher than the possibility that the pad 12*a*-bump 16*a* portion and the board 20 are in a poor connection state in the chip-on-board mounting step. In this manner, when the connection state between the test pad 12*b*-bump 16*b* portion and the board 20 is determined to be good in the final test, the connection state between the pad 12*a*-bump 16*a* portion and the board 20 is determined to be good correspondingly. As a result, it is possible to enhance reliability in determining the connection state between the pad 12*a*-bump 16*a* portion and the board 20.

In this embodiment, both the pads 12*a* and the test pads 12*b* have polygonal planar shapes, and the interior angles b of the planar shapes of the test pads 12*b* are smaller than the interior angles a of the planar shapes of the pads 12*a*. However, the present disclosure is not limited to this specific example. Alternatively, a configuration in which the pads have circular or oval planar shapes and the test pads have polygonal planar shapes, may be employed. In such a case, similar advantages to those of this embodiment can also be obtained.

In this embodiment, the planar shapes of both the pads 12*a* and the test pads 12*b* are regular polygons (i.e., polygons in which all the interior angles are equal), and all the interior angles b of the planar shapes of the test pads 12*b* are smaller than all the interior angles a of the planar shapes of the pads 12*a*. However, the present disclosure is not limited to this specific example. Alternatively, at least one of the interior angles of the planar shape of each of the test pads may be smaller than all the interior angles of the planar shape of the pad. In this case, similar advantages to those of this embodiment can also be obtained.

Figure 4:
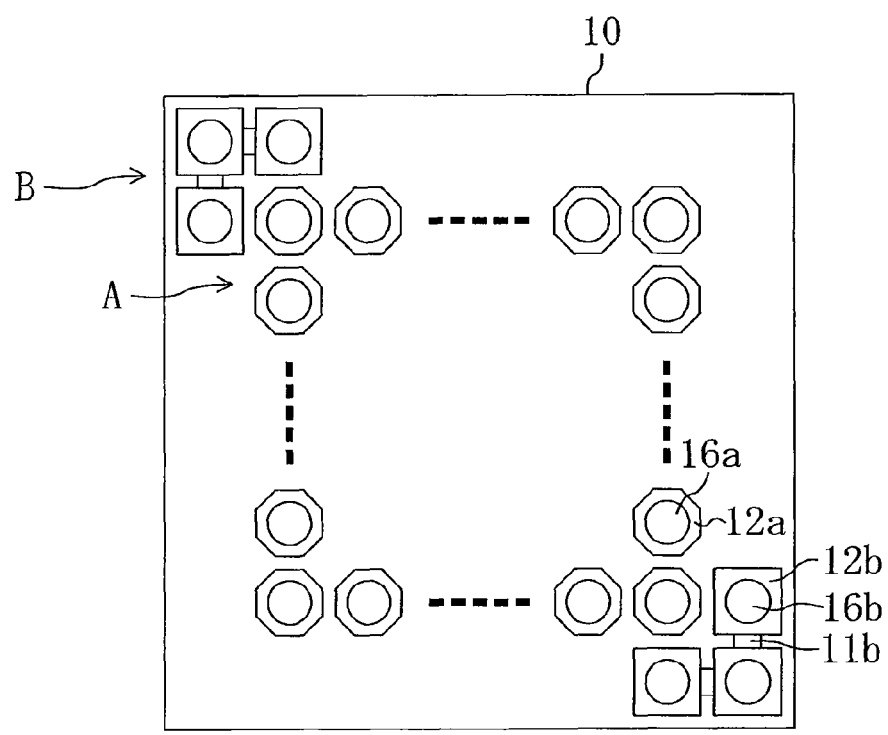
FIG. 4 is a plan view illustrating a configuration of a chip in a semiconductor device according to another example of the first embodiment.

In this embodiment, the interconnects 11*b* constituting the test pad patterns B are formed in the interlayer insulating film 10*x*, i.e., in the chip 10. However, the present disclosure is not limited to this specific example. Alternatively, as illustrated in FIG. 4, the interconnects 11*b* may be formed on the principal surface of the chip 10.

In this embodiment, as illustrated in FIG. 1, the number of the test pads 12*b* constituting each of the test pad patterns B is three. However, the present disclosure is not limited to this specific example. The number of test pads constituting the test pad pattern only needs to be at least two.

In this embodiment, two test pad patterns B are provided on the chip 10, and are respectively disposed at corners selected from the four corners of the chip 10. However, the present disclosure is not limited to this specific example. The number of test pad patterns B provided on the chip only needs to be at least one.

In this embodiment, the test pad patterns B are disposed at corners of the chip 10. However, the present disclosure is not limited to this specific example. The test pad patterns B may be disposed in a portion of the periphery of the chip 10 except for the corners.

In this embodiment, the pad group A is configured such that the pads 12*a* are arranged in an array. However, the present disclosure is not limited to this specific example. The pads may be arranged on the periphery of the chip 10.

In this embodiment, each of the pads 12*a* constituting the pad group A is electrically connected to the internal circuit in the chip 10. However, the present disclosure is not limited to this specific example. Only selected one(s) of the pads may be electrically connected to the internal circuit in the chip, for example.

Embodiment 2

Figure 5:
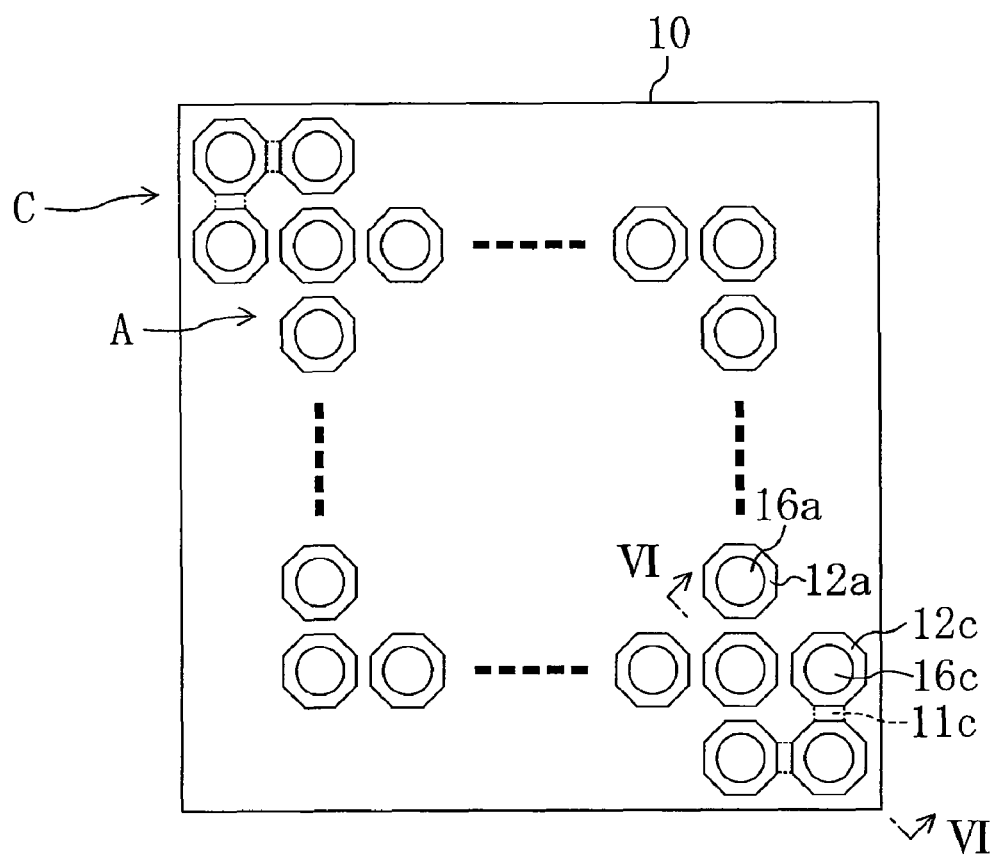
FIG. 5 is a plan view illustrating a configuration of a chip in a semiconductor device according to a second embodiment of the present disclosure.
Figure 6:
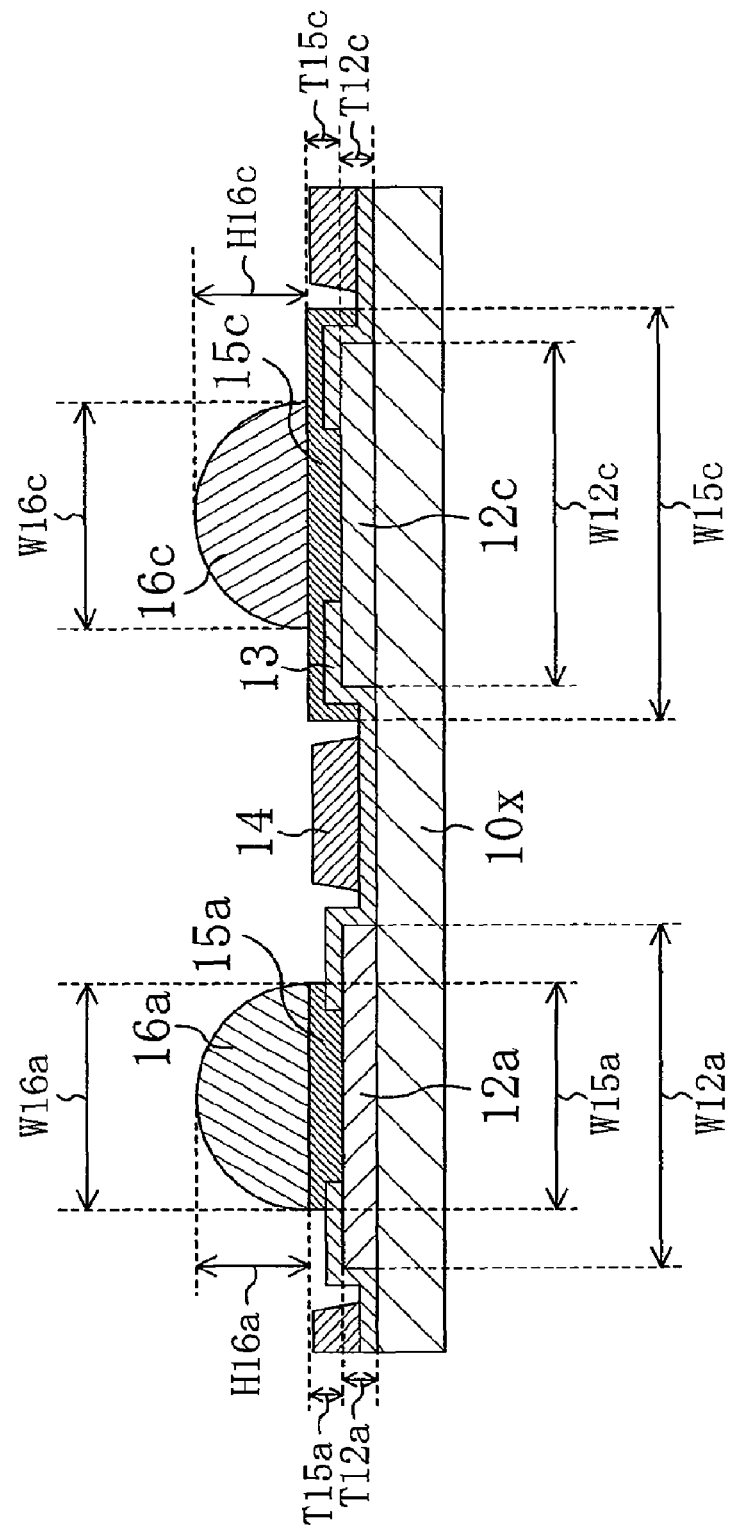
FIG. 6 is a cross-sectional view illustrating the configuration of the chip in the semiconductor device of the second embodiment.

A semiconductor device according to a second embodiment of the present disclosure will be described with reference to FIGS. 5 and 6. FIG. 5 is a plan view illustrating a configuration of a chip in the semiconductor device of the second embodiment. FIG. 6 is a cross-sectional view illustrating the configuration of the chip in the semiconductor device of the second embodiment. Specifically, FIG. 6 is an enlarged cross-sectional view taken along line VI-VI in FIG. 5. In FIGS. 5 and 6, the same reference numerals as in the first embodiment denote the same components in FIGS. 1 and 2. In this embodiment, aspects different from those of the first embodiment will be primarily described, and the same description as in the first embodiment will not be repeated as necessary.

As illustrated in FIG. 5, instead of the test pad patterns B of the first embodiment, test pad patterns C are provided on a chip 10. The test pad patterns C of this embodiment include: a plurality of test pads 12*c* formed on the principal surface of the chip 10; test bumps 16*c* respectively formed on the test pads 12*c* with a test barrier metal layer (not shown, and denoted by reference numeral 15*c* in FIG. 6) interposed therebetween; and interconnects 11*c* electrically connecting adjacent ones of the test pads 12*c*. The test pads 12*c* are not electrically connected to an internal circuit (not shown) in the chip 10.

As illustrated in FIG. 6, the width W12*c* of the test pads 12*c* is equal to the width W12*a* of the pads 12*a* (i.e., W12*c*=W12*a*), and the thickness T12*c* of the test pads 12*c* is equal to the thickness T12*a* of the pads 12*a* (i.e., T12*c*=T12*a*). The width W15*c* of the test barrier metal layer 15*c* is larger than the width W15*a* of the barrier metal layer 15*a* (i.e., W15*c*>W15*a*), and the thickness T15*c* of the test barrier metal layer 15*c* is equal to the thickness T15*a* of the barrier metal layer 15*a* (i.e., T15*c*=T15*a*). The width W16*c* of the test bumps 16*c* is equal to the width W16*a* of the bumps 16*a* (i.e., W16*c*=W16*a*), and the height H16*c* of the test bumps 16*c* is equal to the height H16*a* of the bumps 16*a* (i.e., H16*c*=H16*a*). The thickness T15*c* of the test barrier metal layer 15*c* is the thickness of a portion of the test barrier metal layer 15*c* sandwiched between the test pads 12*c* and the test bumps 16*c*.

In the foregoing manner, in this embodiment, the width W12*c* of the test pads 12*c* is smaller than the width W15*c* of the test barrier metal layer 15*c* (i.e., W12*c*<W15*c*) in the test pad pattern, and the width W12*a* of the pads 12*a* is larger than the width W15*a* of the barrier metal layer 15*a* (W12*a*>W15*a*) in the pad group, as illustrated in FIG. 6.

In the chip-on-board mounting step, the barrier metal layer whose width is larger than the pad width is more likely to be broken than the barrier metal layer whose width is smaller than the pad width. Accordingly, in the chip-on-board mounting step, a pad-bump portion whose width is smaller than the width of the barrier metal layer is more likely to be in a poor contact state with the board than a pad-bump portion whose width is larger than the width of the barrier metal layer.

That is, as illustrated in FIG. 6, the width W12a of the pads 12a is larger than the width W15a of the barrier metal layer 15a in the pad group, and the width W12c of the test pads 12c is smaller than the width W15c of the test barrier metal layer 15c in the test pad patterns. This configuration allows the possibility that the test pad 12c-bump 16c portion and the board are in a poor connection state to be higher than the possibility that the pad 12a-bump 16a portion and the board are in a poor connection state in the chip-on-board mounting step.

In this embodiment, the connection state between the test pads and the test bumps before the chip-on-board mounting step can be electrically tested by using the test pad patterns. Then, based on the determination result in the mid-fabrication test, the connection state between the pads and the bumps before the chip-on-board mounting step can be determined, thereby enhancing reliability in determining the connection state between the pads and the bumps. Accordingly, the reliability of the semiconductor device can be increased by mounting, on a board, a chip in which the connection state between pads and bumps has been determined to be good based on the determination result in the mid-fabrication test.

In addition, the connection state between the test pad 12c-bump 16c portion and the board after the chip-on-board mounting step can be electrically tested by using the test pad patterns. Then, based on the determination result in the final test, the connection state between the pad 12a-bump 16a portion and the board after the chip-on-board mounting step can be determined.

Further, as illustrated in FIG. 5, the test pad patterns C are positioned such that the distance between each of the test pad patterns C and the center of the chip 10 is larger than the distance between the pad group A and the center of the chip 10. Accordingly, the possibility that the test pad 12c-bump 16c portion and the board are in a poor connection state is allowed to be higher than the possibility that the pad 12a-bump 16a portion and the board are in a poor connection state in the chip-on-board mounting step. Furthermore, as illustrated in FIG. 6, the width W12a of the pads 12a is larger than the width W15a of the barrier metal layer 15a in the pad group, and the width W12c of the test pads 12c is smaller than the width W15c of the test barrier metal layer 15c in the test pad patterns. Accordingly, the possibility that the test pad 12c-bump 16c portion and the board are in a poor connection state is allowed to be higher than the possibility that the pad 12a-bump 16a portion and the board are in a poor connection state in the chip-on-board mounting step. In this manner, if the connection state between the test pad 12c-bump 16c portion and the board is determined to be good in the final test, the connection state between the pad 12a-bump 16a portion and the board is determined to be good correspondingly. As a result, it is possible to enhance reliability in determining the connection state between pad 12a-bump 16a portion and the board.

Embodiment 3

Figure 7:
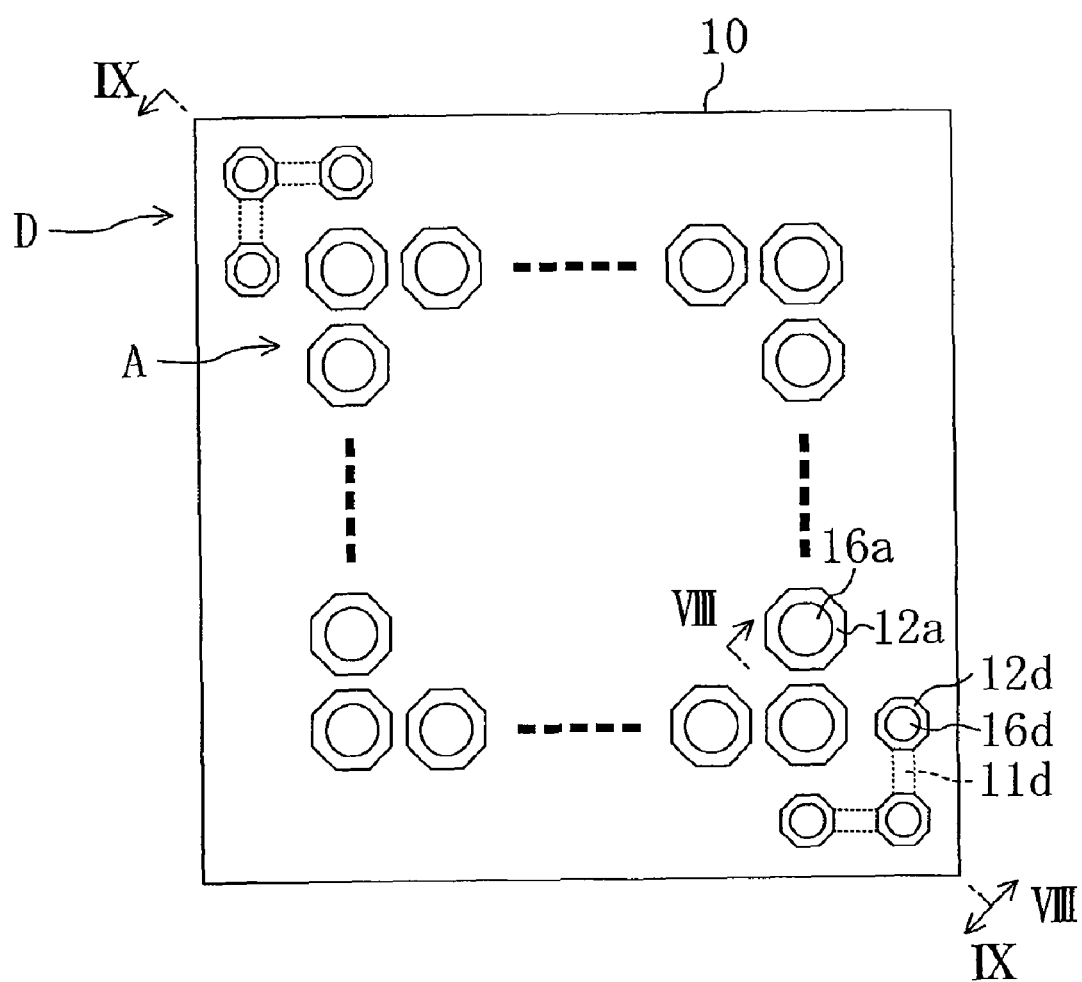
FIG. 7 is a plan view illustrating a configuration of a chip in a semiconductor device according to a third embodiment of the present disclosure.
Figure 8:
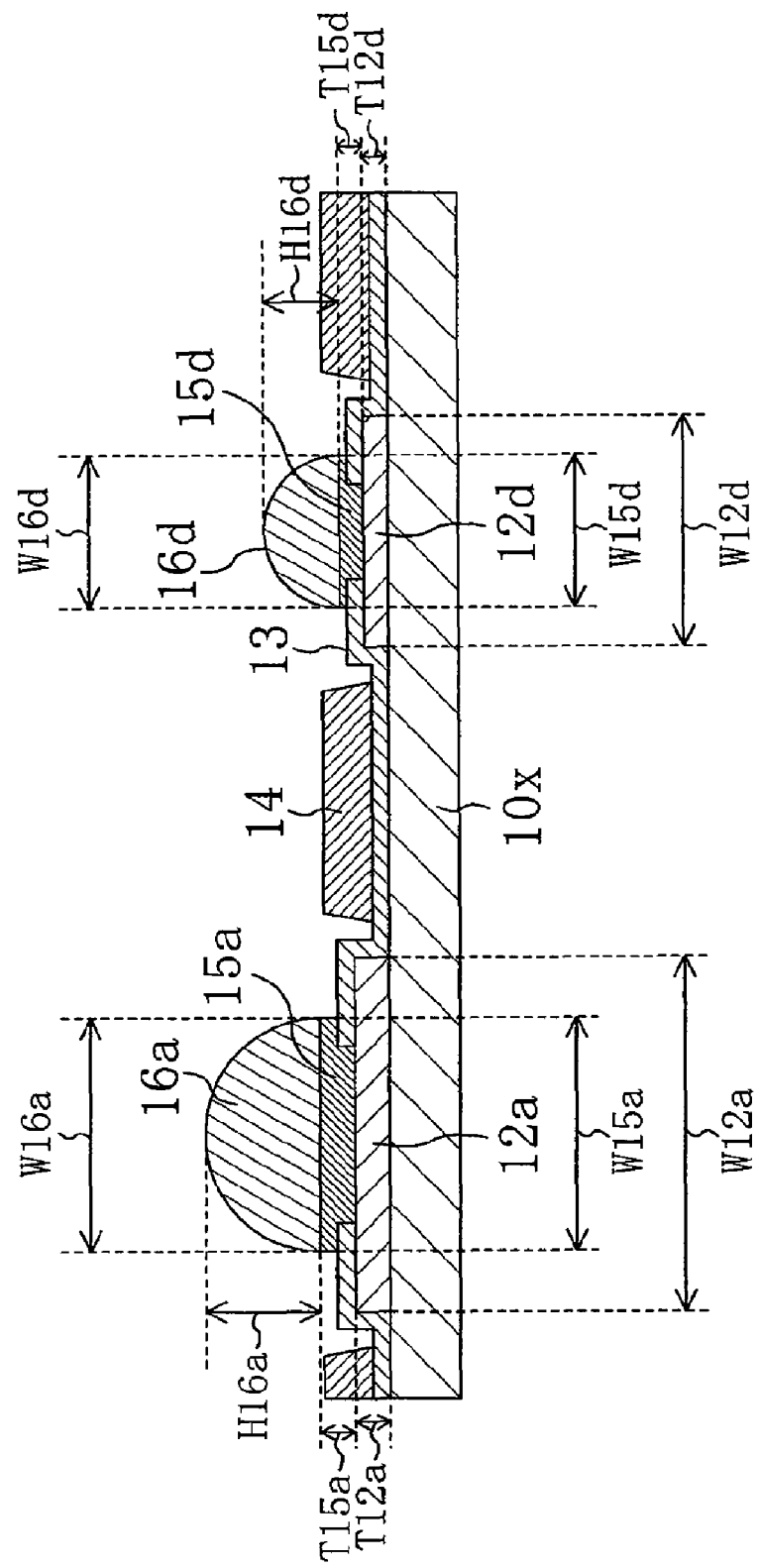
FIG. 8 is a cross-sectional view illustrating the configuration of the chip in the semiconductor device of the third embodiment.
Figure 9:
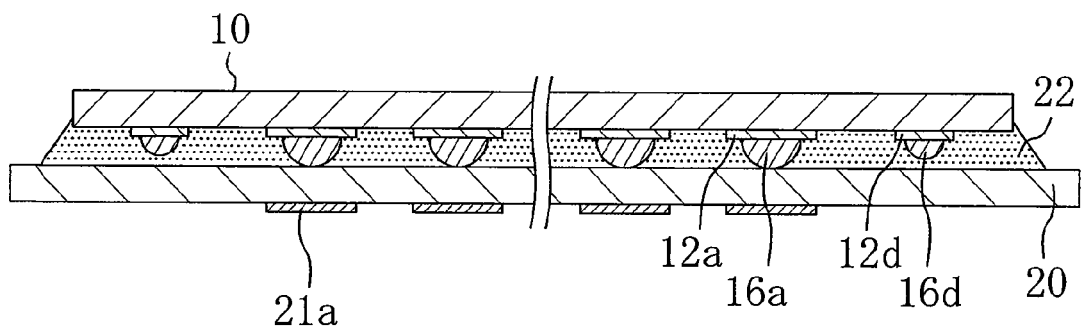
FIG. 9 is a cross-sectional view illustrating a configuration of the semiconductor device of the third embodiment.

A semiconductor device according to a third embodiment of the present disclosure will be described with reference to FIGS. 7, 8, and 9. FIG. 7 is a plan view illustrating a configuration of a chip in the semiconductor device of the third embodiment. FIG. 8 is a cross-sectional view illustrating the configuration of the chip in the semiconductor device of the third embodiment. Specifically, FIG. 8 is a cross-sectional view taken along line VIII-VIII in FIG. 7. FIG. 9 is a cross-sectional view illustrating a configuration of the semiconductor device of the third embodiment. Specifically, the cross-sectional view of the upper chip in FIG. 9 is the cross-sectional view taken along line IX-IX in FIG. 7. In FIGS. 7, 8, and 9, the same reference numerals as in the first embodiment denote the same components in FIGS. 1, 2, and 3. In this embodiment, aspects different from those of the first embodiment will be primarily described, and the same description as in the first embodiment will not be repeated as necessary.

As illustrated in FIG. 7, instead of the test pad patterns B of the first embodiment, test pad patterns D are provided on a chip 10. The test pad patterns D of this embodiment include: a plurality of test pads 12d formed on the principal surface of the chip 10; test bumps 16d respectively formed on the test pads 12d with a test barrier metal layer (not shown, and denoted by reference numeral 15d in FIG. 8) interposed therebetween; and interconnects 11d electrically connecting adjacent ones of the test pads 12d. The test pads 12d are not electrically connected to an internal circuit (not shown) in the chip 10.

As illustrated in FIG. 8, the width W12d of the test pads 12d is smaller than the width W12a of the pads 12a (i.e., W12d<W12a), and the thickness T12d of the test pads 12d is smaller than the thickness T12a of the pads 12a (i.e., T12d<T12a). The width W15d of the test barrier metal layer 15d is smaller than the width W15a of the barrier metal layer 15a (i.e., W15d<W15a), and the thickness T15d of the test barrier metal layer 15d is smaller than the thickness T15a of the barrier metal layer 15a (i.e., T15d<T15a). The width W16d of the test bumps 16d is smaller than the width W16a of the bumps 16a (i.e., W16d<W16a), and the height H16d of the test bumps 16d is smaller than the height H16a of the bumps 16a (i.e., H16d<H16a). The thickness T15d of the test barrier metal layer 15d is the thickness of a portion of the test barrier metal layer 15d sandwiched between the test pads 12d and the test bumps 16d.

As illustrated in FIG. 9, the chip 10 is connected to the board 20 having terminals 21a via the bumps 16a. The gap between the board 20 and the chip 10 is filled with resin 22. In this manner, the chip 10 is mounted on the board 20. The chip 10 is mounted on the board 20 such that the bumps 16a are connected to the terminals 21a and the bumps 16a are connected to the terminals 21a.

In this embodiment, the connection state between the test pads and the test bumps before the chip-on-board mounting step can be electrically tested by using the test pad patterns. Then, based on the determination result in the mid-fabrication test, the connection state between the pads and the bumps before the chip-on-board mounting step can be determined, thereby enhancing reliability in determining the connection state between the pads and the bumps. Accordingly, the reliability of the semiconductor device can be increased by mounting, on a board, a chip in which the connection state between pads and bumps has been determined to be good based on the determination result in the mid-fabrication test.

In addition, as illustrated in FIG. 9, the height (denoted by reference numeral H16d in FIG. 8) of the test bumps 16d is smaller than the height (denoted by reference numeral H16a in FIG. 8) of the bumps 16a, thereby reducing obstruction of filling with resin 22 by the test bumps 16d. Accordingly, as compared to the first and second embodiments, the gap between the board 20 and the chip 10 can be precisely filled with resin 22.

In this embodiment, as illustrated in FIG. 7, the test pad patterns D are positioned such that the distance between each of the test pad patterns D and the center of the chip 10 is larger than the distance between the pad group A and the center of the chip 10. However, the present disclosure is not limited to this specific example.

In this embodiment, as illustrated in FIG. 8, the width and thickness of the test pads 12d are smaller than those of the pads 12a, the width and thickness of the test barrier metal layer 15d are smaller than those of the barrier metal layer 15a, and the width and height of the test bumps 16d are smaller than those of the bumps 16a. However, the present disclosure is not limited to this specific example.

That is, to achieve objects of the present disclosure, it is sufficient that a test pad pattern including test pads whose width and thickness are equal to those of pads, a test barrier metal layer whose width and thickness are equal to those of a barrier metal layer, and test bumps whose width and height are equal to those of bumps is provided on a region of the chip except for the region where the pad group is provided.

Modified Example 1 of Embodiment 3

Figure 10:
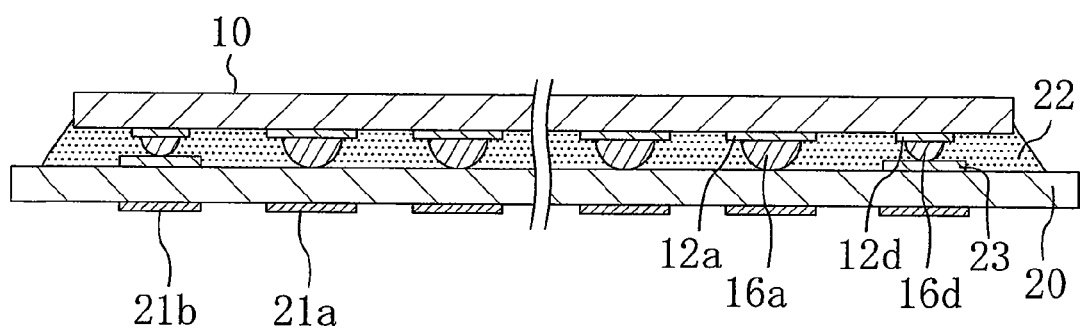
FIG. 10 is a cross-sectional view illustrating a configuration of a semiconductor device according to a first modified example of the third embodiment.

A semiconductor device according to a first modified example of the third embodiment will be described with reference to FIG. 10. FIG. 10 is a cross-sectional view illustrating a configuration of the semiconductor device of the first modified example. In FIG. 10, the same reference numerals as in the third embodiment denote the same components in FIG. 9. In this modified example, aspects different from those of the third embodiment will be primarily described, and the same description as in the third embodiment will not be repeated as necessary.

Structural aspects of this modified example are as follows:

As illustrated in FIG. 10, the semiconductor device of this modified example further includes: terminals 21b formed on the lower surface of the board 20; and pedestals 23 formed on the upper surface of the board 20, electrically connected to the terminals 21b, and electrically connecting the test bumps 16d and the board 20 to each other, in addition to the components of the third embodiment shown in FIG. 9.

When the same thermal stress is applied to a relatively narrow bump and a relatively wide bump, the relatively narrow bump is less resistant to the stress than the relatively wide bump. Accordingly, in the chip-on-board mounting step, a portion including a pad and the relatively narrow bump is more likely to be in a poor contact state with the board than a portion including a pad and the relatively wide bump.

That is, as illustrated in FIG. 10, the width (denoted by reference numeral W16d in FIG. 8) of the test bumps 16d is smaller than the width (denoted by reference numeral W16a in FIG. 8) of the bumps 16a. This configuration allows the possibility that the test pad 12d-bump 16d portion and the board 20 are in a poor connection state to be higher than the possibility that the pad 12a-bump 16a portion and the board 20 are in a poor connection state in the chip-on-board mounting step.

In this modified example, the connection state between the test pads and the test bumps before the chip-on-board mounting step can be electrically tested by using the test pad patterns. Then, based on the determination result in the mid-fabrication test, the connection state between the pads and the bumps before the chip-on-board mounting step can be determined, thereby enhancing reliability in determining the connection state between the pads and the bumps. Accordingly, the reliability of the semiconductor device can be increased by mounting, on a board, a chip in which the connection state between pads and bumps has been determined to be good based on the determination result in the mid-fabrication test.

In addition, the pedestals 23 electrically connecting the test bumps 16d and the board 20 and provided on the board 20, enable the connection state between the test pad 12d-bump 16d portion and the board 20 after the chip-on-board mounting step to be electrically tested by using the test pad patterns. Then, based on the determination result in the final test, the connection state between the pad 12a-bump 16a portion and the board 20 after the chip-on-board mounting step can be determined.

Further, the test pad patterns are positioned such that the distance between each of the test pad patterns and the center of the chip 10 is larger than the distance between the pad group and the center of the chip 10. Accordingly, the possibility that the test pad 12d-bump 16d portion and the board 20 are in a poor connection state is allowed to be higher than the possibility that the pad 12a-bump 16a portion and the board 20 are in a poor connection state in the chip-on-board mounting step. Furthermore, the width of the test bumps 16d is smaller than the width of the bumps 16a. Accordingly, the possibility that the test pad 12d-bump 16d portion and the board 20 are in a poor connection state is allowed to be much higher than the possibility that the pad 12a-bump 16a portion and the board 20 are in a poor connection state in the chip-on-board mounting step. In this manner, if the connection state between the test pad 12d-bump 16d portion and the board 20 is determined to be good in the final test, the connection state between the pad 12a-bump 16a portion and the board 20 is determined to be good correspondingly. As a result, it is possible to enhance reliability in determining the connection state between pad 12a-bump 16a portion and the board 20.

In this modified example, the width and height of the test bumps 16d are smaller than those of the bumps 16a, the width and thickness of the test pads 12d are smaller than those of the pads 12a, and the width and thickness of the test barrier metal layer 15d are smaller than those of the barrier metal layer 15a. However, the present disclosure is not limited to this specific example.

First, a configuration in which the width and height of the test bumps are smaller than those of the bumps, and the width and thickness of the test pads are equal to those of the pads, and the width and thickness of the test barrier metal layer are equal to those of the barrier metal layer, may be employed. In this configuration, similar advantages as those of this modified example can also be obtained.

Second, a configuration in which the width of the test bumps is smaller than that of the bumps, the height of the test bumps is equal to that of the bumps, the width and thickness of the test pads are equal to those of the pads, and the width and thickness of the test barrier metal layer are equal to those of the barrier metal layer, may be employed. In this configuration, similar advantages as those of this modified example can also be obtained. In this configuration, since the height of the test bumps is equal to that of the bumps, the mid-fabrication test and the final test can be performed without pedestals.

Modified Example 2 of Embodiment 3

Figure 11:
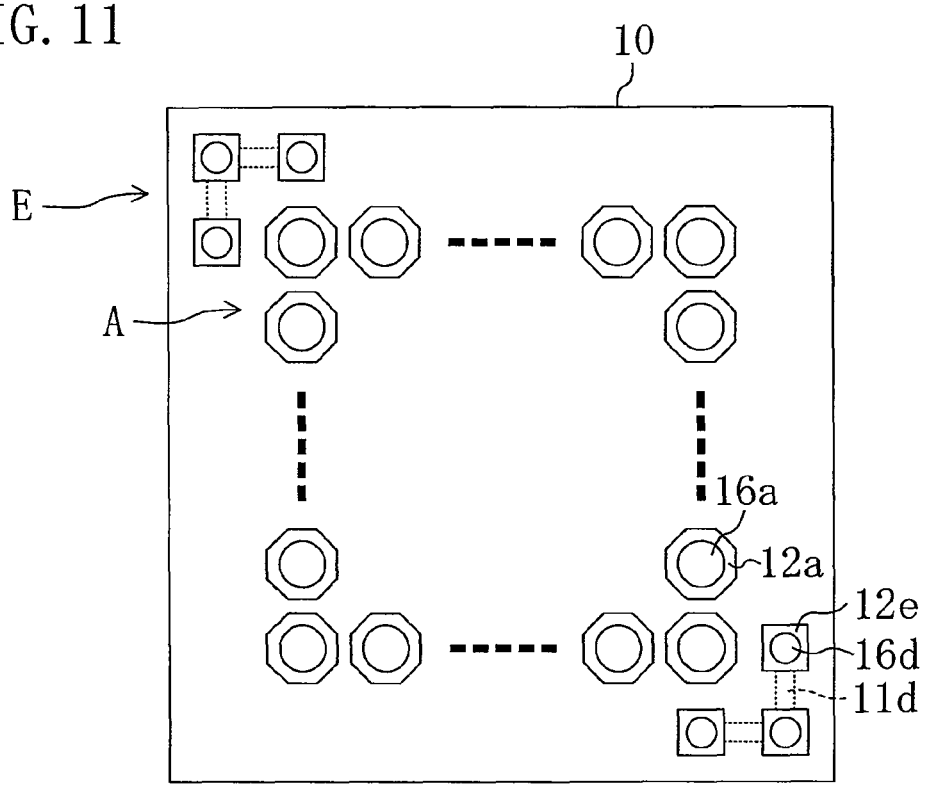
FIG. 11 is a plan view illustrating a configuration of a chip in a semiconductor device according to a second modified example of the third embodiment.

A semiconductor device according to a second modified example of the third embodiment will be described with reference to FIG. 11. FIG. 11 is a plan view illustrating a configuration of a chip in the semiconductor device of the second modified example. In FIG. 11, the same reference numerals as in the third embodiment denote the same components as in FIG. 7.

As illustrated in FIG. 11, instead of the test pad patterns D of the third embodiment shown in FIG. 7, test pad patterns E are provided on a chip 10. The test pad patterns E of this modified example include: a plurality of test pads 12e formed on the principal surface of the chip 10; test bumps 16d respectively formed on the test pads 12e with a test barrier metal layer (not shown) interposed therebetween; and interconnects 11d electrically connecting adjacent ones of the test pads 12e. The test pads 12e are not electrically connected to an internal circuit (not shown) in the chip 10.

Although not shown, as the semiconductor device of the first modified example of the third embodiment shown in FIG. 10, the semiconductor device of this modified example includes: terminals (denoted by reference numeral 21b in FIG. 10) formed on the lower surface of the board; and pedestals (denoted by reference numeral 23 in FIG. 10) formed on the upper surface of the board, electrically connected to the terminals, and electrically connecting the test bumps 16d and the board to each other.

Structural differences between this modified example and the first modified example of the third embodiment are as follows:

In this modified example, as illustrated in FIG. 11, the test pads 12e have rectangular planar shapes, whereas the test pads 12d in the first modified example of the third embodiment have octagonal planar shapes. Specifically, the interior angles of the planar shapes of the test pads 12e in this modified example are smaller than the interior angles of the planar shapes of the test pads 12d in the first modified example of the third embodiment. This configuration allows the possibility that the test pad 12e-bump 16d portion and the board in this modified example are in a poor connection state to be higher than the possibility that the test pad 12d-bump 16d portion and the board in the first modified example of the third embodiment are in a poor connection state in the chip-on-board mounting step. Accordingly, reliability in determining the connection state between the pad 12a-bump 16a portion and the board in this modified example is allowed to be higher than reliability in determining the connection state between the pad 12a-bump 16a portion and the board in the first modified example of the third embodiment.

Modified Example 3 of Embodiment 3

Figure 12:
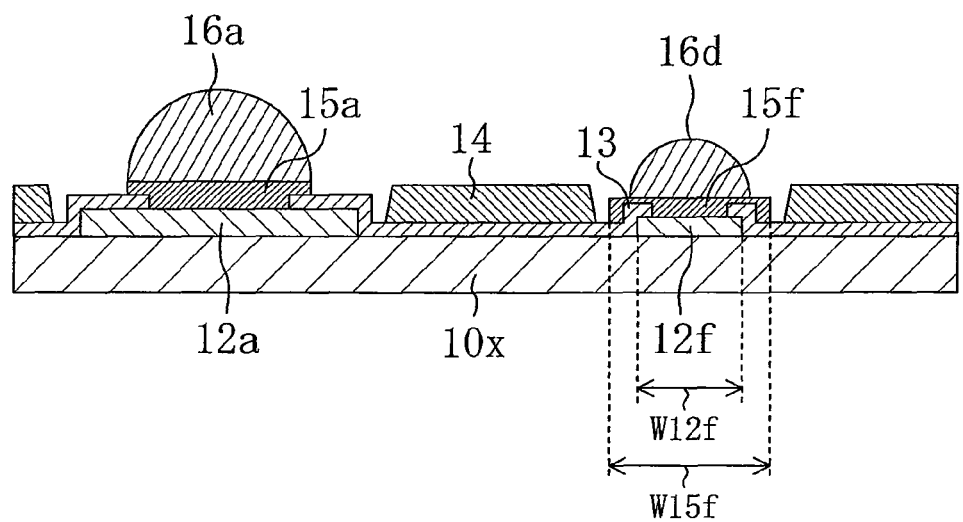
FIG. 12 is a cross-sectional view illustrating a configuration of a chip in a semiconductor device according to a third modified example of the third embodiment.
Figure 13:
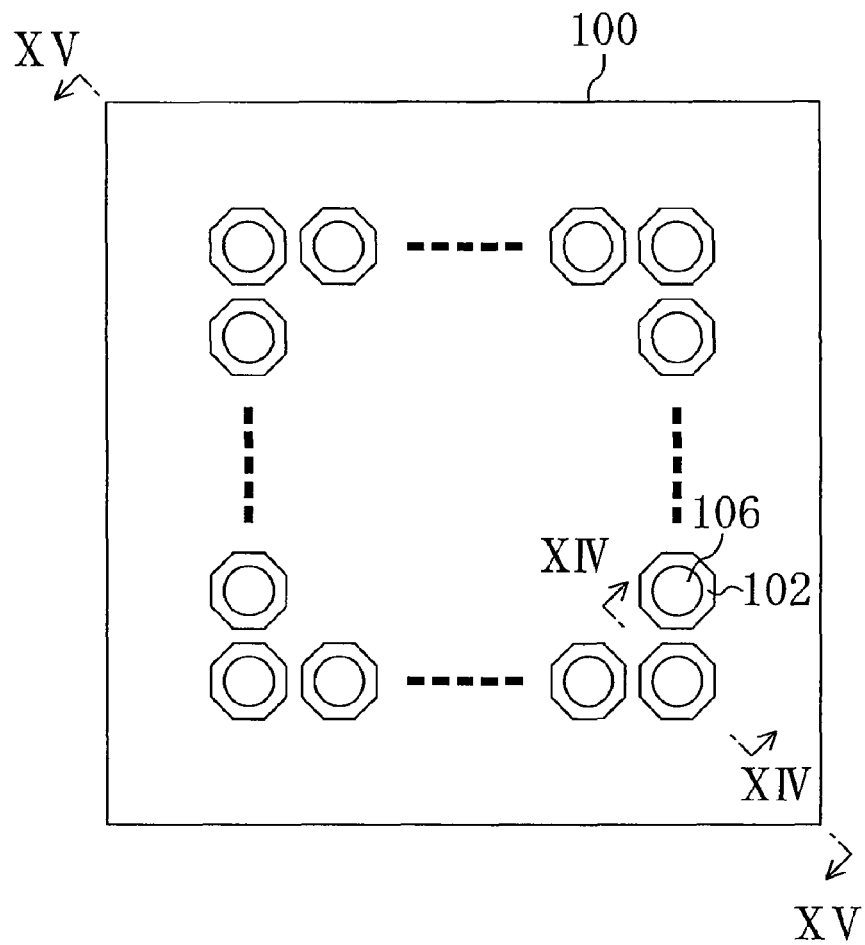
FIG. 13 is a plan view illustrating a configuration of a chip in a conventional semiconductor device.
Figure 14:
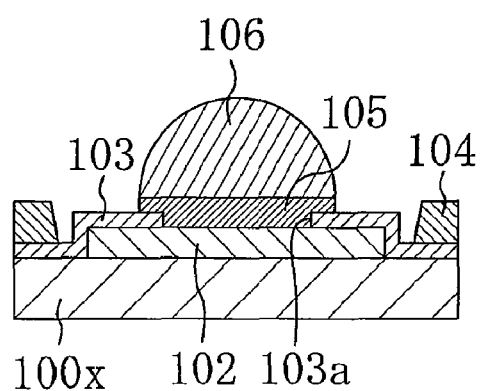
FIG. 14 is a cross-sectional view illustrating the configuration of the chip in the conventional semiconductor device.
Figure 15:
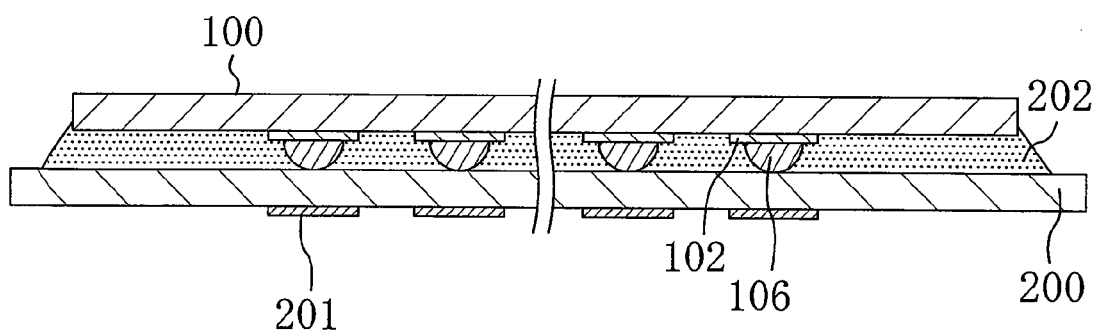
FIG. 15 is a cross-sectional view illustrating a configuration of the conventional semiconductor device.

A semiconductor device according to a third modified example of the third embodiment will be described with reference to FIG. 12. FIG. 12 is a cross-sectional view illustrating a configuration of a chip in the semiconductor device of the third modified example. In FIG. 12, the same reference numerals as in the third embodiment denote the same components in FIG. 8.

As illustrated in FIG. 12, test pad patterns of this modified example include: a plurality of test pads 12f formed on the principal surface of the chip 10; test bumps 16d respectively formed on the test pads 12f with a test barrier metal layer 15f interposed therebetween; and interconnects (not shown) electrically connecting adjacent ones of the test pads 12f. The test pads 12f are not electrically connected to an internal circuit (not shown) in the chip.

Although not shown, as the semiconductor device of the first modified example of the third embodiment shown in FIG. 10, the semiconductor device of this modified example includes: terminals (denoted by reference numeral 21b in FIG. 10) formed on the lower surface of the board; and pedestals (denoted by reference numeral 23 in FIG. 10) formed on the upper surface of the board, electrically connected to the terminals, and electrically connecting the test bumps 16d and the board to each other.

Structural differences between this modified example and the first modified example of the third embodiment are as follows:

In this modified example, as illustrated in FIG. 12, the width 12f of the test pads 12f is smaller than the width W15f of the test barrier metal layer 15f (i.e., W12f<W15f), whereas in the first modified example of the third embodiment, the width of the test pads 12d is larger than the width of the test barrier metal layer 15d. This configuration allows the possibility that the test pad 12f-bump 16d portion and the board in this modified example are in a poor connection state to be higher than the possibility that the test pad 12d-bump 16d portion and the board in the first modified example of the third embodiment are in a poor connection state in the chip-on-board mounting step. Thus, reliability in determining the connection state between the pad 12a-bump 16a portion and the board in this modified example can be higher than reliability in determining the connection state between the pad 12a-bump 16a portion and the board in the first modified example of the third embodiment.

INDUSTRIAL APPLICABILITY

The present disclosure can enhance reliability in determining the connection state between pads and bumps before a chip-on-board mounting step, and therefore, is useful for a semiconductor device in which a chip is mounted on a board.

What is claimed is:

1. A semiconductor device, comprising:
    a board;
    a chip having an upper surface and a lower surface and mounted on the board, the lower surface of the chip facing the board;
    a pad group disposed on the lower surface of the chip and electrically connected to an internal circuit in the chip; and
    a test pad pattern disposed on a region of the lower surface of the chip except for a region of the lower surface of the chip where the pad group is provided, wherein:
    the pad group includes
       a plurality of pads formed on the lower surface of the chip, and
       a plurality of bumps respectively formed on the pads with a barrier metal layer interposed therebetween, and electrically connected to the board,
    the test pad pattern includes
       a plurality of test pads formed on the lower surface of the chip, and
       a plurality of test bumps respectively formed on the test pads with a test barrier metal layer interposed therebetween, and
    wherein a portion of the test pad pattern is disposed outside the pad group and the portion of the test pad pattern is disposed within the lower surface of the chip.

2. The semiconductor device of claim 1, wherein each of the test bumps has a height smaller than a height of each of the bumps, and
    pedestals electrically connecting the test bumps to the board are disposed on an upper surface of the board.

3. The semiconductor device of claim 1, wherein a distance between the test pad pattern and a center of the chip is larger than a distance between the pad group and the center of the chip.

4. The semiconductor device of claim 1, wherein the test pads and the pads have polygonal planar shapes, and
   a planar shape of each of the test pads has an interior angle smaller than an interior angle of a planar shape of each of the pads.

5. The semiconductor device of claim 1, wherein the test pads have polygonal planar shapes, and
   the pads have circular or oval planar shapes.

6. The semiconductor device of claim 1, wherein each of the test pads has a width smaller than a width of the test barrier metal layer, and
   each of the pads has a width larger than a width of the barrier metal layer.

7. The semiconductor device of claim 1, wherein each of the test bumps has a width smaller than a width of each of the bumps.

8. The semiconductor device of claim 1, wherein the bumps and the test bumps are gold bumps or solder bumps.

9. The semiconductor device of claim 1, wherein the pads and the test pads contain aluminum, and
   the barrier metal layer and the test barrier metal layer contain nickel.

10. A chip having an upper surface and a lower surface to be mounted on a board, the lower surface of the chip facing the board, the chip comprising:
   a pad group disposed on the lower surface of the chip and electrically connected to an internal circuit in the chip; and
   a test pad pattern disposed on a region of the lower surface of the chip except for a region of the lower surface of the chip where the pad group is provided, wherein:
   the pad group includes
      a plurality of pads formed on the lower surface of the chip, and
      a plurality of bumps respectively formed on the pads with a barrier metal layer interposed therebetween, and configured to be electrically connected to the board,
   the test pad pattern includes
      a plurality of test pads formed on the lower surface of the chip, and
      a plurality of test bumps respectively formed on the test pads with a test barrier metal layer interposed therebetween, and
   wherein a portion of the test pad pattern is disposed outside the pad group and the portion of the test pad pattern is disposed within the lower surface of the chip.

11. The semiconductor device of claim 1, wherein the test bumps have a height substantially equal to a height of the bumps.

12. The semiconductor device of claim 1, wherein each of the test bumps has a height smaller than a height of each of the bumps.

13. The semiconductor device of claim 1, wherein the test pad pattern is disposed at a corner of the chip.

14. The semiconductor device of claim 1, wherein the test pad pattern is not electrically connected to the internal circuit in the chip.

15. The semiconductor device of claim 1, wherein adjacent ones of the test pads in the test pad pattern are electrically connected.

16. The semiconductor device of claim 1, wherein all portions of the test pad pattern are disposed outside the pad group.

17. The chip of claim 10, wherein the test bumps have a height substantially equal to a height of the bumps.

18. The chip of claim 10, wherein the test pad pattern is disposed at a corner of the chip.

19. The chip of claim 10, wherein the test pad pattern is not electrically connected to the internal circuit in the chip.

20. The chip of claim 10, wherein all portions of the test pad pattern are disposed outside the pad group.

* * * * *